United States Patent
Khadem et al.

[11] Patent Number: 5,886,878
[45] Date of Patent: Mar. 23, 1999

[54] PRINTED CIRCUIT BOARD MANUFACTURING METHOD FOR THROUGH HOLE COMPONENTS WITH A METAL CASE

[75] Inventors: Gita P. Khadem; Darrell J. Slupek, both of Austin, Tex.

[73] Assignee: Dell USA, L.P., Round Rock, Tex.

[21] Appl. No.: 786,158

[22] Filed: Jan. 21, 1997

[51] Int. Cl.[6] ...................................................... H05K 1/11
[52] U.S. Cl. .................. 361/770; 174/138 G; 278/180.1; 361/760; 361/767; 361/779
[58] Field of Search ............................ 29/837, 840, 846; 174/138 G; 228/179.1, 180.1; 257/697, 698, 699, 700, 708, 723, 724; 361/760, 767, 770, 771, 773, 777, 782, 783, 807, 809; 438/369, 612; 439/68, 82–84

[56] References Cited

U.S. PATENT DOCUMENTS

| | | | |
|---|---|---|---|
| 4,339,785 | 7/1982 | Ohsawa | 361/782 |
| 4,573,105 | 2/1986 | Beldavs | 361/762 |
| 4,833,570 | 5/1989 | Teratani | 174/138 G |
| 5,111,991 | 5/1992 | Clawson et al. | 228/180 |
| 5,129,573 | 7/1992 | Duffey | 228/180 |
| 5,155,904 | 10/1992 | Majd | 29/837 |
| 5,489,752 | 2/1996 | Cognetti et al. | 174/266 |
| 5,726,861 | 3/1998 | Ostrem | 361/767 |

*Primary Examiner*—Donald Sparks
*Attorney, Agent, or Firm*—Skjerven, Morrill, MacPherson, Franklin & Friel L.L.P.; Stephen A. Terrile

[57] ABSTRACT

The present application describes a through-hole component insulator and assembly process which has the advantages of preventing solder from contacting the metal case of a through-hole component without an addition step or additional material from the standard fabrication process for a printed circuit board. The printed circuit board of the present invention includes a printed ink spacer disposed beneath the through-hole component wherein the printed ink spacer is included with a standard silk-screen artwork layer in the printed circuit board design stage. The printed ink spacer raises the through-hole component from the printed circuit board surface to prevent solder from contacting the metal case of the through-hole component during the printed circuit board soldering stage. Using a silk-screen artwork layer which includes at least one printed ink spacer in the artwork, the printed ink spacer is deposited during deposition of a standard printed design on the printed circuit board fabrication.

6 Claims, 1 Drawing Sheet

PRINTED CIRCUIT BOARD MANUFACTURING METHOD FOR THROUGH HOLE COMPONENTS WITH A METAL CASE

BACKGROUND OF THE INVENTION

1. Field of the Invention

This invention relates to fabrication of printed circuit board assemblies and in particular printed circuit boards having through-hole components packaged in metal cases.

2. Description of the Related Art

Printed circuit boards for electronic circuits are widely used in almost every electronic field today. Printed circuit board assemblies are comprised of a printed circuit board and electronic components which are positioned on and electrically connected to circuitry formed on the printed circuit board. Printed circuit boards as manufactured have a continuous foil of conductive material adhered to at least one of the surfaces of a core of dielectric material. The continuous conductive foil on the printed circuit board is thereafter patterned using conventional techniques to remove portions of the conductive material so as to form a predetermined circuit pattern. Holes are punched or drilled through the circuit board at predetermined locations with the holes generally being in registration with selected solder pads formed as part of the circuit pattern etched in the conductive foil. Electronic components are then mounted at predetermined locations on the printed circuit board. The electronic components are temporarily secured in place until they can be permanently soldered in place.

Generally, when manufacturing printed circuit board assemblies leaded components, wherein the electronic components have leads extending from the casing for connecting the component to the circuitry of the board, the components are mounted on the surface of the board opposite the side where the circuitry is normally formed and the leads of the component are inserted through the preformed holes in the printed circuit board. The leads are then mass soldered to the circuitry of the printed circuit board by methods such as dip or wave soldering. Mass soldering of leaded components is a relatively straightforward process in that the leaded components are mounted on the top surface of the printed circuit board, which does not enter the solder bath, while the bottom surface having the circuitry defined thereon with the leads in registration with the solder pads is immersed in the solder bath for soldering.

The holes may also be plated through-holes which extend the full thickness of the board and open to solder pads on both surfaces on the board. Electronic components designed to mount to PCBs by means of plated through holes typically have depending metal leads which are spaced apart and sized to fit into corresponding plated through-holes and extend a small distance beyond the undersurface of the PCB. Conventionally, through-hole devices are connected to the PCB by machine wave soldering—i.e., the solder side of the circuit board is passed across a wave of molten solder. If two clean metal surfaces are held together and dipped into molten solder, the solder will wet the metal and climb up to fill the gaps between the adjacent surfaces. This phenomenon is the result of capillary action. Capillary action causes the molten solder to fill the annular space between the component lead and the walls of the plated through-hole. Upon cooling and solidifying, the solder forms a fillet around the lead and the ends of the plated through-hole.

There is a problem, however, with through-hole components packaged in metal cases. As the printed circuit board travels over the wave solder to solder components to the printed circuit board, solder wicks up the through-hole and shorts to the metal case on the top side of the board. Some components are designed with a stand-off feature built into the component itself in order to prevent the problem of shorting during soldering, however, many are designed to sit flush with the surface of the printed circuit board at the time of wave soldering. Industry practice solves this problem by installing an insulator (i.e. tape or any other pre-cut spacer) between the component and the board so that the component is raised from the printed circuit board surface and solder will not short to the component package. This method, however, requires additional material and labor to be added to the assembly process of the printed circuit board assembly in order to place the spacer underneath the component, therefore increasing manufacturing time and costs.

SUMMARY OF THE INVENTION

The present application describes a component insulator and fabrication process which has the advantages of preventing the solder from contacting the metal case of a through-hole component without an addition step or additional material to the standard fabrication process for a printed circuit board. The printed circuit board of the present invention includes a printed ink spacer disposed beneath the through-hole component wherein the printed ink spacer is included with a silk-screen artwork layer in the printed circuit board design stage. The printed ink spacer raises the through-hole component from the printed circuit board surface to prevent solder from contacting the metal case of the through-hole component during the printed circuit board soldering stage. Using a silk-screen artwork layer which includes at least one printed ink spacer in the artwork, the printed ink spacer is deposited during deposition of a standard printed design on the printed circuit board, providing a cost and time efficient solution to the problem encountered when soldering through-hole components packaged in metal cases.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

Figure 1:
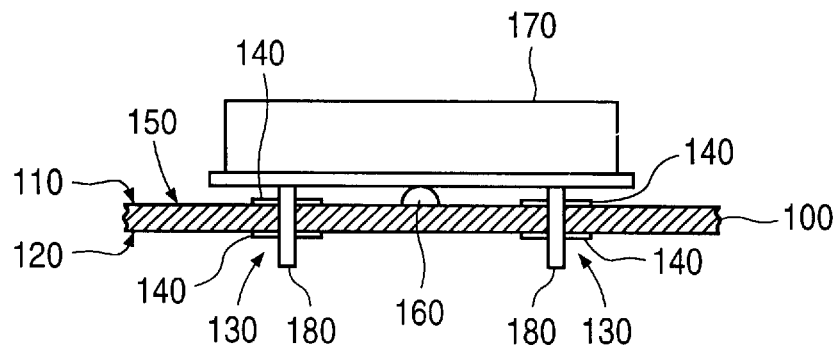
FIG. 1 is a side view illustrating a portion of a printed circuit board including the through-hole component insulator of the present invention.

Illustrated in the side view in FIG. 1 is a printed circuit board 100 substrate structure with primary and secondary opposite sides 110 and 120, respectively, including a series of transmission lines (not shown) formed in the printed circuit board 100 substrate structure. A spaced series of plated through-holes 130 with solder pads 140 are formed extending transversely between the primary and secondary opposite sides 110 and 120, respectively.

The method of the present invention includes depositing a printed design on the primary side 110 of the printed circuit board 100 using a silk-screen artwork layer 150 and including at least one printed ink spacer 160. The silk-screen artwork layer 150 is a part of the standard artwork layer used in the design stages of the printed circuit board 100, therefore, the printed ink spacer 160 is deposited without an additional step in the fabrication process and without adding any new materials to the process. Any number or configuration of printed ink spacers 160, for example, may be used in the present invention. The printed ink spacer 160, as illustrated in FIG. 1, is, for example, a circular silk-screen ink dot and is composed of any standard silk-screen ink material used in the printed circuit industry, such as, for example, a nonconductive silk-screen printing ink. The printed ink spacer 160, however, may be of any shape or size to optimize effectiveness.

At least one through-hole component 170, packaged in a metal case and including leads 180, is positioned on the primary side 110 of the printed circuit board 100. The through-hole component 170 such as, for example, a capacitor, a crystal or an isolator, is designed to sit flush with the surface of the printed circuit board 100 and may be of any shape or dimension. As shown, the leads 180 are disposed in said plated through-holes 130 and the printed ink spacer 160 is located beneath the through-hole component 170. The leads 180 are then soldered (not illustrated), by wave soldering, for example, on the secondary side 120 of the printed circuit board 100, to the plated through-holes 130. The molten solder flows up through the plated through-holes 130 to the primary side 110 as a result of capillary action and fills the annular space between the through-hole component 170 lead 180 and the plated through-hole 130. Standard silk-screen ink materials produce a circular silk-screen ink dot ( the printed ink spacer 160), for example, with sufficient volume and height to raise the through-hole component 170 sufficiently to insulate the through-hole component's 170 metal case from the molten solder. The printed ink spacer 160 raises the through-hole component 170 from the printed circuit board 100 surface to prevent the molten solder from contacting the metal case of the through-hole component 170 wherein the electric through-hole component 170 is not shorted by the molten solder.

Figure 2:
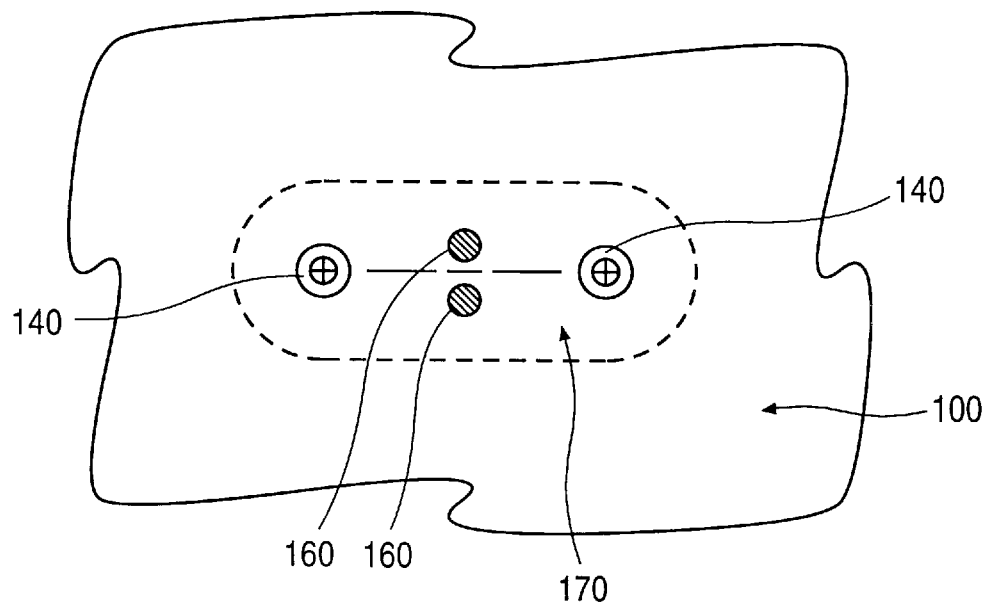
FIG. 2 is a top plan view of the printed circuit board of FIG. 1, before assembly of the components.

FIG. 2 is a top plan view of the printed circuit board and solder pads 140 of FIG. 1 with the through-hole component 170 illustrated as a see-through dotted line in order to further illustrate the printed ink spacers 160. One or more printed ink spacers 160 may be used in order to optimize the isolation feature of the present invention.

The through-hole component insulator and method of fabrication of the present invention is well suited for printed circuit boards used in any type of electronic equipment including computer systems, such as, for example, printed circuit boards of a small computer system interface (SCSI) used to connect microcomputers with peripherals or other computers. The printed circuit board 100 of course, includes one or more transmission lines (not illustrated) that may be composed of microstrip lines or other proper striplines and the transmission lines couple the components on the printed circuit board. Also, input and output terminals of a proper circuit may of course be connected to the printed circuit board for a proper purpose.

The present invention accomplishes insulation of through-hole components packaged in metal cases from molten solder during the solder stage of a printed circuit board assembly without adding any additional steps or any additional materials to the fabrication process of the printed circuit board. Other embodiments are within the following claims, and, while only certain preferred features of the invention have been shown by way of illustration, many modifications and changes will occur. It is therefore to be understood that the present claims are intended to cover all such modifications and changes which fall within the true spirit of the invention.

What is claimed is:

1. For use on a printed circuit board having at least one through-hole component having a metal case, a through-hole component insulator comprising:

a printed ink spacer disposed beneath the through-hole component wherein said printed ink spacer is included with a silk-screen artwork layer in the printed circuit board design stage and wherein said printed ink spacer raises the through-hole component from the printed circuit board surface to prevent solder from contacting the metal case of the through-hole component during the printed circuit board soldering stage.

2. The through-hole component insulator of claim 1 wherein said printed ink spacer is composed of a nonconductive silk-screen printing ink.

3. The through-hole component insulator of claim 1 wherein said printed ink spacer is a circular silk-screen ink dot.

4. A computer system including a through-hole component insulator on a printed circuit board, the printed circuit board having plated through-holes and including at least one through-hole component having a metal case and leads, the through-hole component coupled to additional circuit components on the printed circuit board, the through-hole component insulator comprising:

at least one printed ink spacer disposed beneath the through-hole component wherein said printed ink spacer is included with a silk-screen artwork layer in the printed circuit board design stage and wherein said printed ink spacer raises the through-hole component from the printed circuit board surface to prevent solder from contacting the metal case of the through-hole component during the printed circuit board soldering stage.

5. The computer system of 4 wherein said printed ink spacer is composed of a nonconductive silk-screen printing ink.

6. The computer system of 4 wherein said printed ink spacer is a circular silk-screen ink dot.

* * * * *